(12) United States Patent
McTigue et al.

(10) Patent No.: US 6,856,126 B2
(45) Date of Patent: Feb. 15, 2005

(54) DIFFERENTIAL VOLTAGE PROBE

(75) Inventors: Michael T. McTigue, Colorado Springs, CO (US); Kenneth Rush, Colorado Springs, CO (US); Bob Kimura, Colorado Springs, CO (US); Michael J. Lujan, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 95 days.

(21) Appl. No.: 10/349,390

(22) Filed: Jan. 21, 2003

(65) Prior Publication Data

US 2004/0140819 A1 Jul. 22, 2004

(51) Int. Cl.[7] .......................... G01R 31/02; G01R 1/06; G01R 27/26; G01R 27/08
(52) U.S. Cl. ...................... 324/72.5; 324/149; 324/690; 324/715; 324/724
(58) Field of Search ............................... 324/72.5, 149, 324/690, 754, 715, 724

(56) References Cited

U.S. PATENT DOCUMENTS 4,743,839 A * 5/1988 Rush ..................... 324/72.5
5,796,308 A * 8/1998 Link et al. ................. 330/284
6,373,348 B1 * 4/2002 Hagerup ................... 333/81 A

* cited by examiner

Primary Examiner—N. Le
Assistant Examiner—John Teresinski

(57) ABSTRACT

A voltage probe includes a first signal lead configured to receive a first signal from a device under test, a first probe-tip network that is coupled to the first signal lead and that has a frequency response that includes a first transmission zero, a first compensation network that is coupled to the first probe-tip network and that has a frequency response that includes a first transmission pole, a second signal lead configured to receive a second signal from the device under test, a second probe-tip network that is coupled to the second signal lead and that has a frequency response that includes a second transmission zero, a second compensation network that is coupled to the second probe-tip network and that has a frequency response that includes a second transmission pole, and a differential amplifier circuit that is coupled to the first compensation network and to the second compensation network, and that is configured to provide a third signal that is responsive to the first signal and to the second signal. Methods and other systems for providing electrical connections to devices under test are disclosed.

27 Claims, 7 Drawing Sheets

PROBE TIP 220-1 RESPONSE

PROBE TIP 220-2 RESPONSE

COMPENSATION
NETWORK 230-1
RESPONSE

COMPENSATION
NETWORK 230-2
RESPONSE

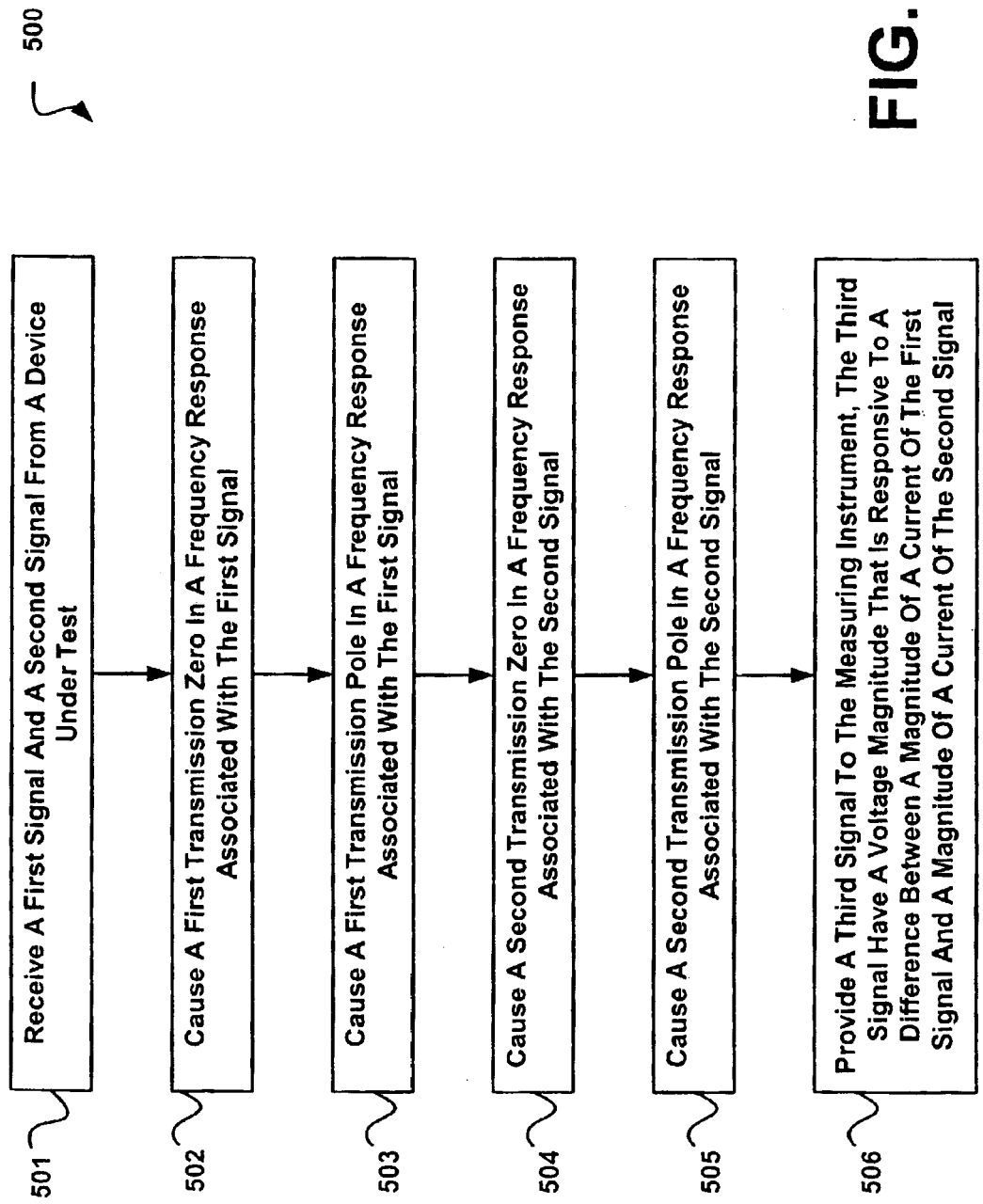

DIFFERENTIAL VOLTAGE PROBE

DESCRIPTION OF THE RELATED ART

The frequency response of a measurement of a signal is dependent upon the capacitance of a probe in parallel with the source impedance of the point being probed. The capacitive reactance of the probe varies as a function of frequency, thereby causing the impedance of the probe to also vary with frequency. This variation limits the accuracy of a probe measurement because the impedance of the probe falls substantially at high frequencies. One approach for extending the effective bandwidth of a probe has been to compensate for the capacitance of a probe by using active electronics at the probe tip. However, this has typically caused a probe tip to be bulky and easily damaged.

The usefulness of a voltage probe depends upon the range of frequencies for which the response is true to the detected signal, the accuracy of replication, and the extent to which the probe detects the signal without detrimentally affecting the operation of the system or circuit being probed. If the input resistance of the combined probe and end-use device is the same order of magnitude as that of the circuit or system being probed, it may cause errors in the replication of the signal or a change in the operation of the circuit or system resulting in erroneous output or circuit malfunction. High probe tip capacitance can also cause circuit loading problems at higher frequencies. Designing a probe to have low capacitance and high input impedance (relative to the impedance of the circuit being probed at the point of probing) has been a common protection against these errors. This high impedance causes very little current to flow through the probe, allowing the circuit to operate relatively undisturbed.

Typical voltage probes include high resistance probes which minimize resistive loading and which have high input impedance at direct current (dc). The impedance in such probes falls off rapidly with increasing frequency due to high input capacitance. High impedance cables are used with these probes to minimize capacitance, but such cables are very lossy at high frequencies, thereby limiting bandwidth. High resistance probes also require the measuring instrument to have a high impedance.

Also available are passive divider probes which have low input capacitance and, therefore, a broad bandwidth. However, the low input impedance could cause problems with resistive loading, and could force the circuit under test into saturation or nonlinear operation, or to stop operating completely.

Another type of voltage probe is an active field effect transistor probe which has active electronics at the probe tip to compensate for loading problems due to low input impedance. Such probes have a higher input impedance than the resistive divider probes and a lower capacitance than the high impedance probes, but are limited in bandwidth by the available field effect transistors, and are bulky and easily damaged. Based on the foregoing, it should be understood that there is a need for systems and/or methods that address these and/or other perceived shortcomings of the prior art.

SUMMARY

Systems and methods for providing electrical connections to devices under test are disclosed. In one embodiment, a voltage probe includes a first signal lead configured to receive a first signal from a device under test, a first probe-tip network that is coupled to the first signal lead and that has a frequency response that includes a first transmission zero, a first compensation network that is coupled to the first probe-tip network and that has a frequency response that includes a first transmission pole, a second signal lead configured to receive a second signal from the device under test, a second probe-tip network that is coupled to the second signal lead and that has a frequency response that includes a second transmission zero, a second compensation network that is coupled to the second probe-tip network and that has a frequency response that includes a second transmission pole, and a differential amplifier circuit that is coupled to the first compensation network and to the second compensation network, and that is configured to provide a third signal that is responsive to the first signal and to the second signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily drawn to scale, emphasis instead being placed upon clearly illustrating the principles of the present invention. In the drawings, like reference numerals designate corresponding parts throughout the several views.

FIG. 5 is a flow chart depicting an embodiment of a method for providing signals to a measuring instrument, according to the invention.

DETAILED DESCRIPTION

Figure 1:
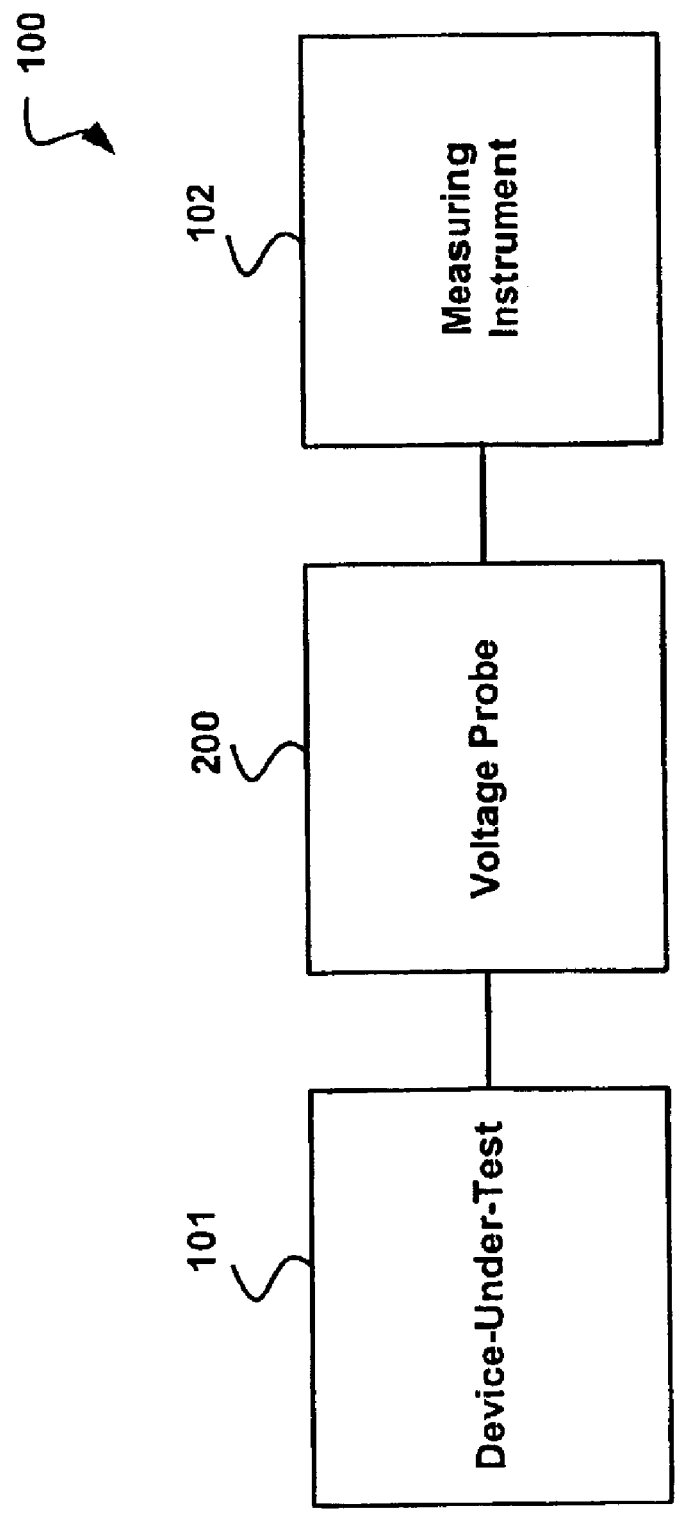
FIG. 1 is a block diagram depicting an embodiment of a measurement system according to the present invention.

FIG. 1 is a block diagram depicting an embodiment of a measurement system 100 according to the present invention. The measurement system 100 includes a differential voltage probe 200 that is coupled to a measuring instrument 102 and to a device-under-test 101. The device-under-test 101 may be, for example, an electronic device or circuit that is to be tested. The probe 200 is configured to provide the measuring instrument 102 with probe signals that are responsive to input signals received by the probe 200 from the device-under-test 101. The measuring instrument 102 is configured to measure one or more characteristics of probe signals received from the probe 200. The measuring instrument 102 may be, for example, an oscilloscope, a spectrum analyzer, a logic analyzer, a vector analyzer, a network analyzer, or a time interval analyzer, among others.

Figure 2:
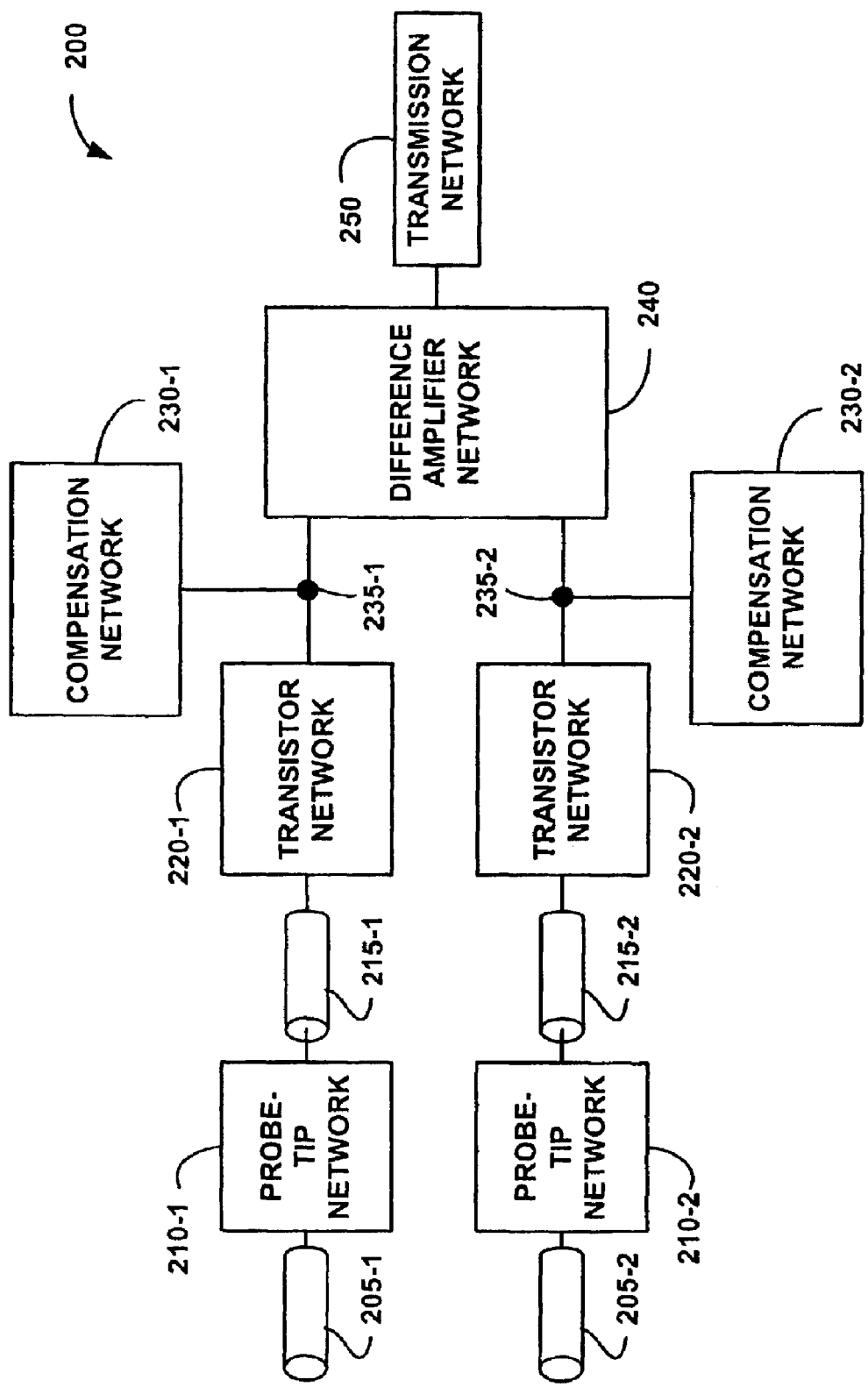
FIG. 2 is a block diagram depicting an embodiment of selected components of a voltage probe, according to the present invention.

FIG. 2 is a block diagram depicting an embodiment of selected components of a voltage probe 200, according to the present invention. The voltage probe 200 includes signal leads 205-1 and 205-2, probe-tip networks 210-1 & 210-2, transmission lines 215-1 & 215-2, transistor networks 220-1 & 220-2, compensation networks 230-1 & 230-2, difference amplifier circuit 240, and transmission network 250. The transistor networks 220-1 & 220-2, compensation networks 230-1 & 230-2, and difference amplifier circuit 240 are preferably implemented using a single application specific integrated circuit (ASIC). A transmission line 215-i (i.e., 215-1 or 215-2) preferably comprises a thin coaxial cable (e.g., a 30 gauge cable) and is preferably configured to be easily connected to and disconnected from a respective transistor network 220-i.

The probe-tip networks 210-1 & 210-2 detect signals received from a device under test 101 (FIG. 1) via respective signal leads 205-1 & 205-2 that are coupled to testing points in the device under test 101. The transistor networks 220-1 & 220-2 receive signals from respective probe-tip networks 210-1 & 210-2 via the transmission lines 215-1 & 215-2, respectively, and transfer the signals to respective nodes 235-1 & 235-2. Each node 235-i (i.e., 235-1 or 235-2) is coupled between a respective compensation network 230-i and the difference amplifier circuit 240. The compensation networks 230-1 & 230-2 modify the frequency response of signals received from respective transistor networks 220-1 & 220-2 to compensate for the transfer functions of respective probe-tip networks 210.

The difference amplifier circuit 240 outputs a voltage signal that is responsive to the difference between the input current signals received by the difference amplifier circuit 240. A voltage signal that is output by the difference amplifier circuit 240 may be conducted by the transmission network 250 to the measuring instrument 102 (FIG. 1).

Figure 3:
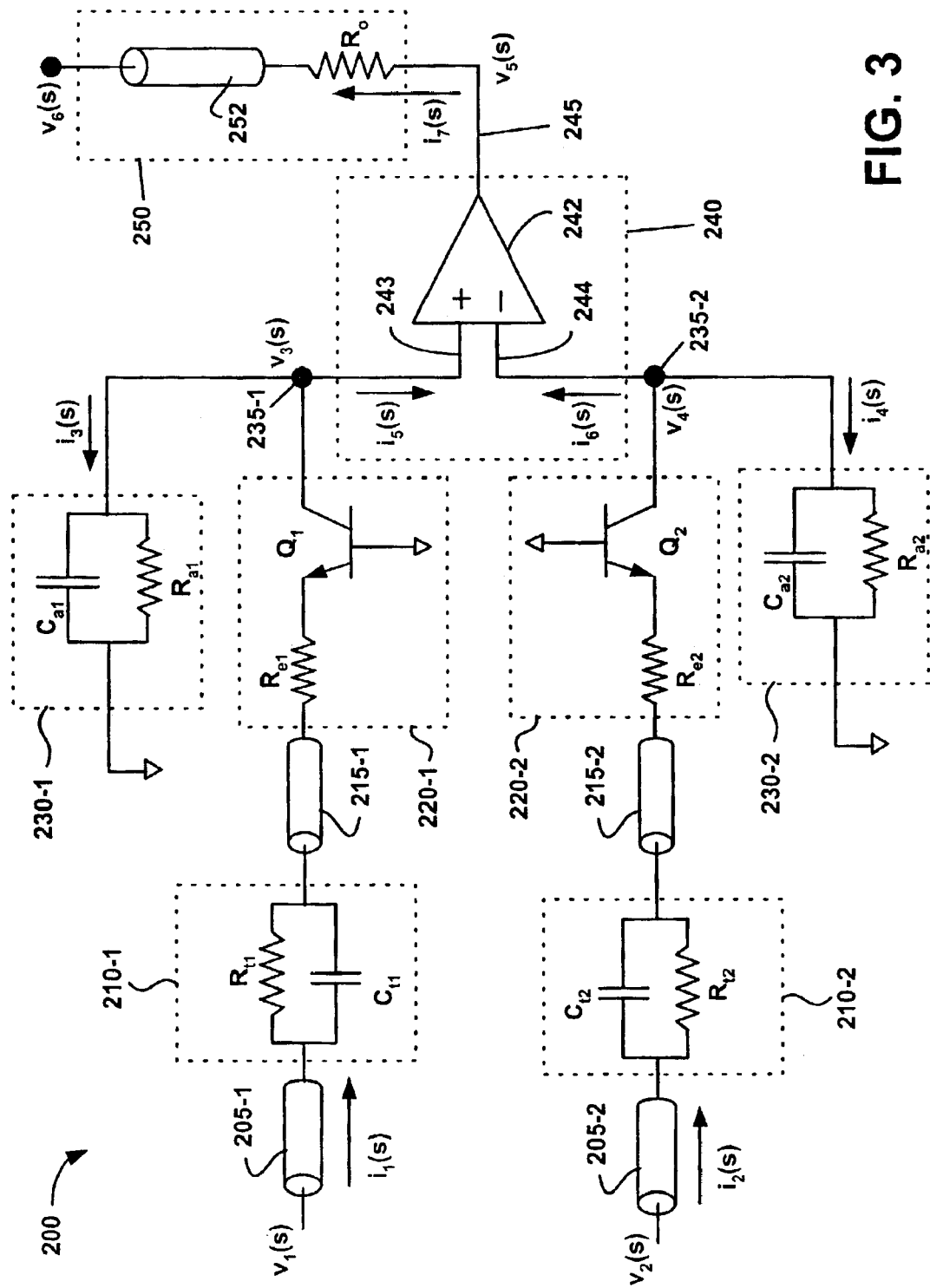
FIG. 3 is a circuit diagram of the voltage probe depicted in FIG. 2.

FIG. 3 is a circuit diagram of the voltage probe 200 depicted in FIG. 2. Note that the voltage probe 200 may be configured to include different and/or additional components than shown in FIG. 3, within the scope of the present invention. As shown in FIG. 3, the probe-tip network 210-1 includes a parallel combination of a resistor $R_{t1}$ and a capacitor $C_{t1}$; the transistor network 220-1 includes a resistor $R_{e1}$ and a common-base configured bipolar junction transistor $Q_1$; and the compensation network 230-1 includes a parallel combination of a resistor $R_{a1}$ and a capacitor $C_{a1}$. Although the difference amplifier circuit 240 is shown to include a single amplifier 242, the difference amplifier circuit 240 may be implemented using a plurality of amplifiers.

The parallel combination of the resistor $R_{t1}$ and the capacitor $C_{t1}$ is coupled in series between the signal lead 205-1 and the transmission line 215-1. The resistor $R_{e1}$ is coupled between the transmission line 215-1 and the emitter of the transistor $Q_1$. The base of the transistor $Q_1$ is coupled to ground. The collector of the transistor $Q_1$ is coupled to a node 235-1, which is in turn coupled to a first input connector 243 of the difference amplifier 242. The parallel combination of resistor $R_{a1}$ and capacitor $C_{a1}$ is coupled to node 235-1 at one end, and to ground at the other end.

The probe-tip network 210-2, transistor network 220-2, and compensation network 230-2 are configured in a similar manner as their counterpart components (probe-tip network 210-1, transistor network 220-1, and compensation network 230-2, respectively). The probe-tip network 210-2 includes a parallel combination of a resistor $R_{t2}$ and a capacitor $C_{t2}$; the transistor network 220-2 includes a resistor $R_{e2}$ and a common-base configured bipolar junction transistor $Q_2$; and the compensation network 230-2 includes a parallel combination of a resistor $R_{a2}$ and a capacitor $C_{a2}$.

The parallel combination of the resistor $R_{t2}$ and the capacitor $C_{t2}$ is coupled in series between the signal lead 205-2 and the transmission line 215-2. The resistor $R_{e2}$ is coupled between the transmission line 215-2 and the emitter of the transistor $Q_2$. The base of the transistor $Q_2$ is coupled to ground. The collector of the transistor $Q_2$ is coupled to a node 235-2, which is in turn coupled to a second input connector 244 of the difference amplifier 242. The parallel combination of resistor $R_{a2}$ and capacitor $C_{a2}$ is coupled to node 235-2 at one end, and to ground at the other end.

When the voltage probe 200 is in operation, a voltage $v_1(s)$ applied at the signal lead 205-1 will produce a current $i_1(s)$ entering the probe-tip network 210-1. The input impedance $z_1(s)$ of the probe 200 at the signal lead 205-1 may be determined as follows:

$$z_1(s) = \left. \frac{R_{t1}(1/sC_{t1})}{(1/sC_{t1}) + R_{t1}} + R_{e1} + r_{e1} \right|_{s=jw} \quad (EQ\ 1)$$

$$= \left. \frac{R_{t1}}{1 + sC_{t1}R_{t1}} + R_{e1} + r_{e1} \right|_{s=jw}$$

where $\omega = 2\pi f$, and $r_{e1}$ is the emitter resistance of $Q_1$.

The emitter resistance $r_{e1}$ of the transistor $Q_1$ is very small. The resistance $R_{e1}$ is chosen such that the resistance $(R_{e1} + r_{e1})$ will equal or approximate the characteristic impedance of the transmission line 215-1. A transmission line terminated in its characteristic impedance, such as the transmission line 215-1, will have an equivalent impedance equal to its characteristic impedance at all frequencies. A transmission line with low characteristic impedance is chosen to provide low losses in transmitting high frequency signals. Consequently, the resistance $(R_{e1} + r_{e1})$ is very small as compared to the impedance of the probe-tip network 210-1. Therefore, the input impedance $z_1(s)$ may be approximated as follows:

$$z_1(s) \approx \left. \frac{R_{t1}}{1 + sC_{t1}R_{t1}} \right|_{s=jw} \quad (EQ\ 2)$$

The probe-tip network 210-1 has a voltage input $v_1(s)$ and a current output $i_1(s)$. Therefore the transfer function of output divided by input is:

$$\frac{i_1(s)}{v_1(s)} \approx \left. \left( \frac{1 + sC_{t1}R_{t1}}{R_{t1}} \right) \right|_{s=jw} \quad (EQ\ 3)$$

The numerator of the transfer function is known as a "transmission zero" and has a 3-dB frequency occurring at $(sC_{t1}R_{t1}=1)$. The response of the probe-tip network 210-1 may be approximated as follows:

$$\frac{i_1(s)}{v_1(s)} \approx \left. \left( \begin{array}{ll} \frac{1}{R_{t1}}, & sC_{t1}R_{t1} \ll 1 \\ sC_{t1}, & sC_{t1}R_{t1} \gg 1 \end{array} \right) \right|_{s=jw} \quad (EQ\ 4)$$

Figure 4A:
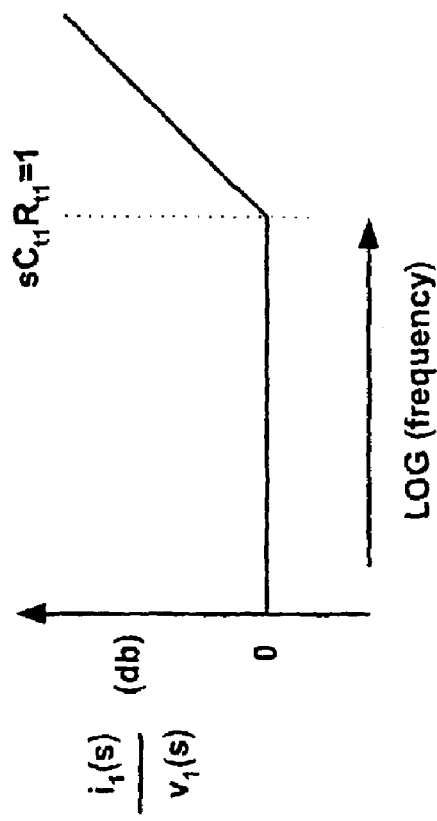
FIG. 4A is a diagram depicting a frequency response of a probe-tip network.

Graphing the response of the probe-tip network 210-1 on a Bode diagram yields the graph shown in FIG. 4A. From dc to $(sC_{t1}R_{t1}=1)$, the gain is a constant $(1/R_{t1})$. From $(sC_{t1}R_{t1}=1)$ to infinity, the gain rises at a constant rate of 20 dB/decade.

Similarly, the probe-tip network 210-2 will have a response that can be approximated as follows:

$$\frac{i_2(s)}{v_2(s)} \approx \left( \begin{array}{ll} \frac{1}{R_{t2}}, & sC_{t2}R_{t2} \ll 1 \\ sC_{t2}, & sC_{t2}R_{t2} \gg 1 \end{array} \right)\Bigg|_{s=jw} \quad \text{(EQ 5)}$$

Figure 4B:
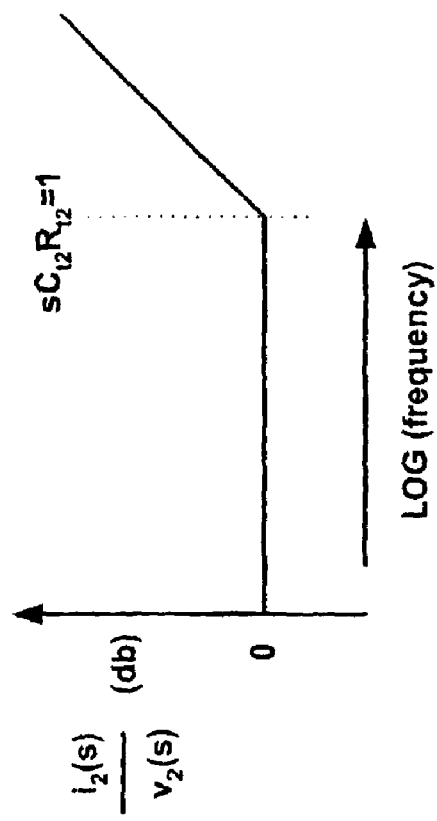
FIG. 4B is a diagram depicting a frequency response of another probe-tip network.

Graphing the response of the probe-tip network 210-2 on a Bode diagram yields the graph shown in FIG. 4B. From dc to ($sC_{t2}R_{t2}=1$), the gain is a constant ($1/R_{t2}$). From ($sC_{t2}R_{t2}=1$) to infinity, the gain also rises at a constant rate of 20 dB/decade.

The compensation networks 230-1 & 230-2 are used to compensate for the transmission zeros that are caused by the probe-tip networks 210-1 & 210-2, respectively. The compensation network 230-1 has an input of $i_3(s)$ and an output of $v_3(s)$. The transfer function for the compensation network 230-1 can therefore be approximated as follows:

$$\frac{v_3(s)}{i_3(s)} \approx \left( \frac{R_{a1}}{1+sR_{a1}C_{a1}} \right)\Bigg|_{s=jw} \quad \text{(EQ 6)}$$

The denominator of the transfer function is known as a "transmission pole," and has a 3-dB frequency occurring at ($sC_{a1}R_{a1}=1$). The response of the compensation network 230-1 can be approximated as follows:

$$\frac{v_3(s)}{i_3(s)} \approx \left( \begin{array}{ll} R_{a1}, & sR_{a1}C_{a1} \ll 1 \\ \frac{1}{sC_{a1}}, & sR_{a1}C_{a1} \gg 1 \end{array} \right)\Bigg|_{s=jw} \quad \text{(EQ 7)}$$

Figure 4C:
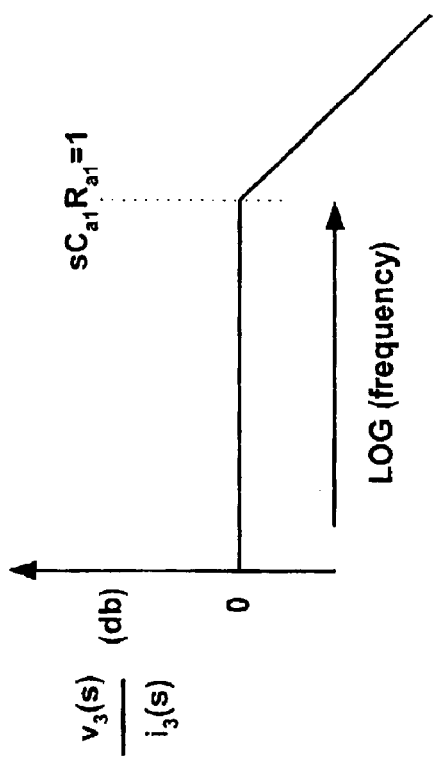
FIG. 4C is a diagram depicting a frequency response of a compensation network.

Graphing the response of the compensation network 230-1 on a Bode diagram yields the graph shown in FIG. 4C. From dc to ($sC_{a1}R_{a1}=1$), the gain is a constant ($R_{a1}$) at dc. From ($sC_{a1}R_{a1}=1$) to infinity the gain falls at a constant 20 dB/decade.

Similarly, the compensation network 230-1 will have a response as follows:

$$\frac{v_4(s)}{i_4(s)} \approx \left( \begin{array}{ll} R_{a2}, & sR_{a2}C_{a2} \ll 1 \\ \frac{1}{sC_{a2}}, & sR_{a2}C_{a2} \gg 1 \end{array} \right)\Bigg|_{s=jw} \quad \text{(EQ 8)}$$

Figure 4D:
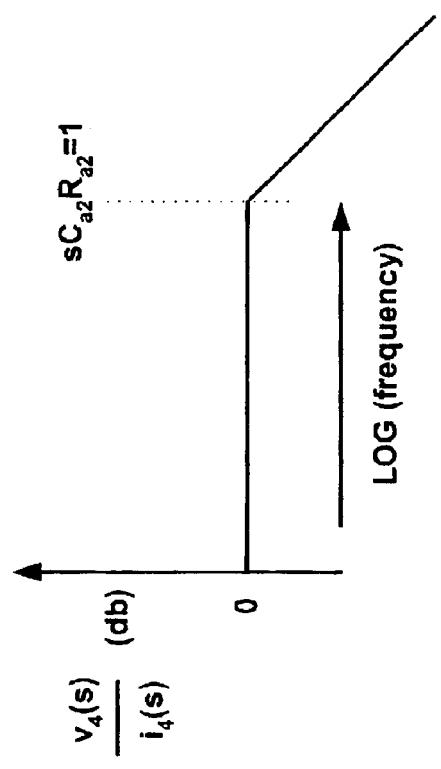
FIG. 4D is a diagram depicting a frequency response of another compensation network.

Graphing the response of the compensation network 230-2 on a Bode diagram yields the graph shown in FIG. 4D. From dc to ($sC_{a2}R_{a2}=1$), the gain is a constant ($R_{a2}$) at dc. From ($sC_{a2}R_{a2}=1$) to infinity the gain falls at a constant 20 dB/decade.

The resistances $R_{t1}$ & $R_{a1}$ and capacitances $C_{a1}$ & $C_{t1}$ are chosen such that ($R_{t1}C_{t1}=R_{a1}C_{a1}$) and therefore ($1+sC_{a1}R_{a1}=1+sC_{t1}R_{t1}$), and the transmission pole of the compensation network 230-1 cancels the transmission zero of the probe-tip network 210-1. Similarly, the resistances $R_{t2}$ & $R_{a2}$ and capacitances $C_{a2}$ & $C_{t2}$ are chosen such that ($R_{t2}C_{t2}=R_{a2}C_{a2}$) and therefore ($1+sC_{a2}R_{a2}=1+sC_{t2}R_{t2}$), and the transmission pole of the compensation network 230-2 cancels the transmission zero of the probe-tip network 210-2. The cancellation of the transmission zeros by the transmission poles allow the gain for the probe to be virtually constant with respect to frequency.

The difference amplifier 242 receives input currents $i_5(s)$ and $i_6(s)$ via input connections 243 and 244, respectively, and outputs a voltage $v_5(s)$ via an output connection 245. The voltage $v_5(s)$ is equal to an amplification factor A times a difference between the input currents $i_5(s)$ and $i_6(s)$; i.e., $v_5(s)=(i_5(s)-i_6(s))*A$ (Volts/Amp). The amplification factor A may be on the order of thousands of Volts/Amp, and may be set based on a desired input/output ratio for the voltage probe 200. The voltage $v_5(s)$ causes a current $i_7(S)$ to flow through the resistor $R_o$ and the transmission line 252. A voltage drop across the resistor $R_o$ and the transmission line 252 results in a voltage $v_6(s)$ at the output of the voltage probe 200. The voltage $v_6(s)$ is equal to a constant K times a difference between the input voltages $v_1(s)$ and $v_2(s)$; i.e., $v_6(s)=K(v_1(s)-v_2(s))$. Where the constant K remains virtually unchanged in response to changes in frequency.

FIG. 5 is a flow chart depicting an embodiment of a method 500 for providing signals to a measuring instrument, according to the invention. Some or all of the steps of method 500 may be performed out of the order shown, including substantially concurrently or in reverse order. The method 500 includes receiving a first signal and a second signal from a device under test, as indicated in step 501. After the signals are received, a first transmission zero is caused in a frequency response associated with the first signal, as indicated in step 502, and a first transmission pole is caused in a frequency response associated with the first signal, as indicated in step 503. The first transmission pole is configured to cancel the effect of the first transmission zero. Similarly, a second transmission zero is caused in a frequency response associated with the second signal, as indicated in step 504, and a second transmission pole is caused in a frequency response associated with the second signal, as indicated in step 505. The second transmission pole is configured to cancel the effect of the second transmission zero. Finally, in step 506, a third signal is provided to the measuring instrument. The third signal has a voltage value that is responsive to a difference between a value of a current of the first signal and a value of a current of the second signal.

Figure 6:
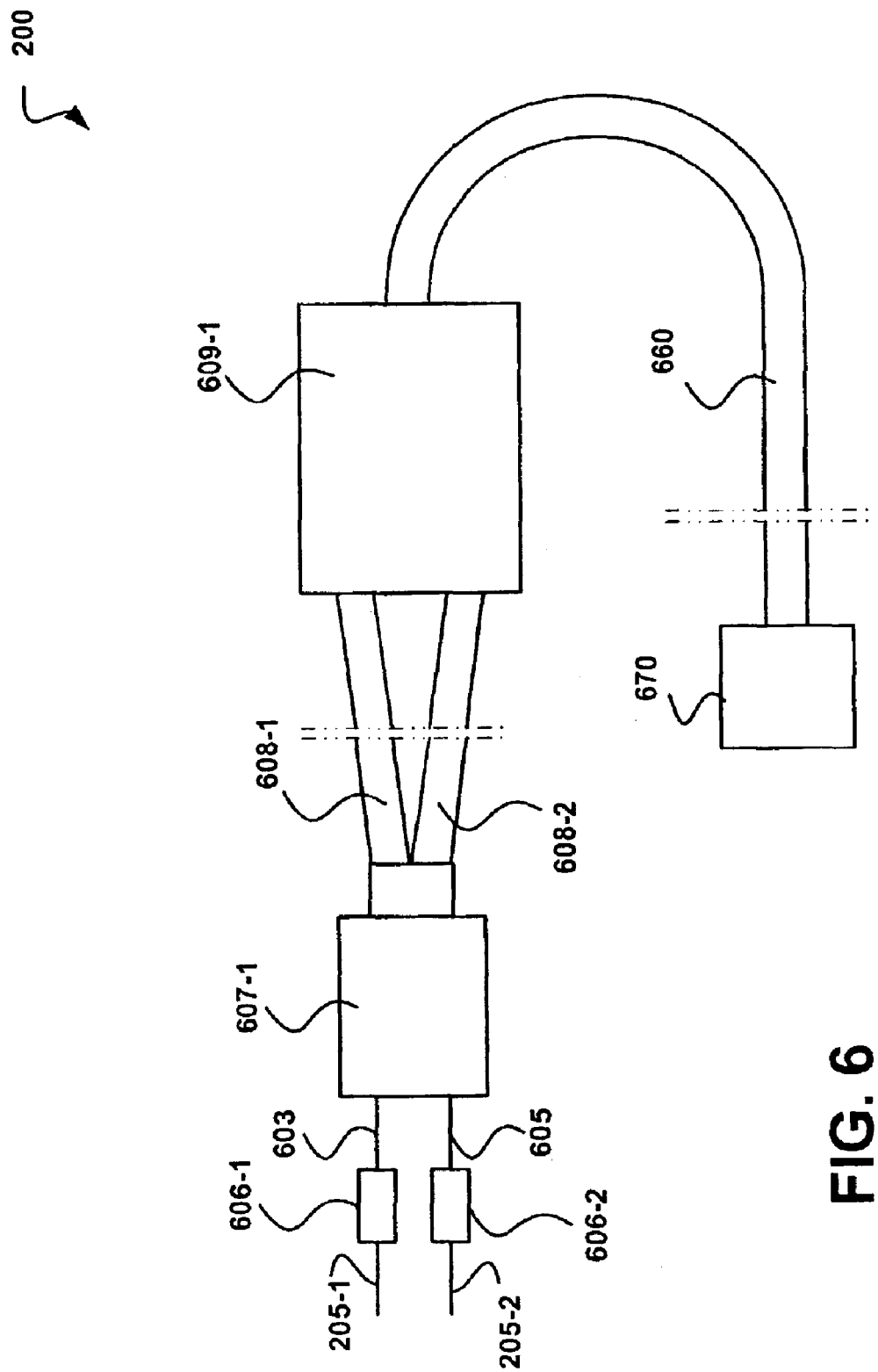
FIG. 6 is a schematic diagram depicting a non-limiting example of an external configuration of a voltage probe.

FIG. 6 is a schematic diagram depicting a non-limiting example of an external configuration of a voltage probe 200. The differential probe 200 includes signal leads 205-1 & 205-2 that are connected to respective damping resistors 606-1 and 606-2. The signal leads 205-1 & 205-2 may be connected (e.g., soldered) to probing points in a device-under-test 101 (FIG. 1). A differential probe-tip unit 607-1, which houses the probe-tip networks 210-1 and 210-2 (FIG. 2), is connected to the resistors 606-1 and 606-2 via connections 603 and 605, respectively. In one embodiment, the signal lead 205-1 and the connection 603 may be manufactured as part of a resistor component that includes the damping resistor 606-1. Similarly, the signal lead 205-2 and the connection 605 may be manufactured as part of a resistor component that includes the damping resistor 606-2.

The differential probe-tip unit 607-1 is relatively small and lightweight (e.g., as compared to the amplifier unit 609-1), thereby facilitating attaching (e.g., through, soldering) the differential probe-tip unit 607-1 to the probing points (not shown) of a device-under-test 101 (FIG. 1). The differential probe-tip unit 607-1 is connected via cables 608-1 and 608-2 to a differential amplifier unit 609-1. The differential amplifier unit 609-1 includes an ASIC comprising the transistor networks 220-1 & 220-2, the compensation networks 230-1 & 230-2, and the difference amplifier circuit 240.

Each of the cables 608-1 & 608-2 may include cable insulation or sheathing that houses one or more types of conductors, including, for example, transmission lines 215-1 & 215-2 (FIG. 2). The probe cables 608-1 & 608-2 preferably offer relatively little resistance to being flexed as compared to, for example, the power supply and signal transmission cable (PSSTC) 660. The high flexibility of the probe cables 608-1 & 608-2 facilitates handling of the differential amplifier unit 609-1 without causing substantial movement of a connected probe-tip unit 607-1.

The differential amplifier unit 609-1 is connected via the PSSTC 660 to a measuring instrument interface 670. The PSSTC 660 may include cable insulation or sheathing that houses various conductors. For example, the PSSTC 660 comprises transmission line 252 (FIG. 3) for transmitting output signals to a measuring instrument 102 (FIG. 1). Additionally, the PSSTC 660 may comprise one or more power conductors that are configured to provide direct current (DC) electrical power from the measuring instrument 102 to the differential amplifier unit 609-1. Thus, for example, the power conductors may include a positive conductor, a negative conductor, and a ground conductor. The PSSTC 660 may additionally include other conductors for various purposes such as, for example, to transmit control signals to/from the differential amplifier unit 609-1.

It should be emphasized that the above-described embodiments of the present invention are merely possible examples, among others, of the implementations, setting forth a clear understanding of the principles of the invention. Many variations and modifications may be made to the above-described embodiments of the invention without departing substantially from the principles of the invention. All such modifications and variations are intended to be included herein within the scope of the disclosure and present invention and protected by the following claims.

What is claimed is:

1. A method for providing signals to a measuring instrument, the method comprising:
    receiving a first signal and a second signal from a device under test;
    modifying the first signal using a first circuit located within a probe tip unit, the first circuit; having a frequency response that includes a first transmission zero;
    transmitting the modified first signal from the probe tip unit along a first flexible transmission line to an amplifier unit located remote from the probe tip unit;
    further modifying the first signal using a second circuit located within the amplifier unit, the second circuit having a frequency response that includes a first transmission pole;
    modifying the second signal using a third circuit located within the probe tip unit, the third circuit having a frequency response that includes a second transmission zero;
    transmitting the modified second signal from the probe tip unit alone a second flexible transmission line to the amplifier unit;
    further modifying the second signal using a fourth circuit located within the amplifier unit, the fourth circuit having a frequency response that includes a second transmission pole; and
    providing a third signal to the measuring instrument, the third signal having a voltage value that is responsive to a difference between a value of a current of the further modified first signal and a value of a current of the further modified second signal.

2. The method of claim 1, wherein the first circuit comprises a resistor and a capacitor that are connected in parallel.

3. The method of claim 2, wherein the third circuit comprises a resistor and a capacitor that are connected in parallel.

4. The method of claim 1, wherein the measuring instrument is one of an oscilloscope, a spectrum analyzer, a logic analyzer, a vector analyzer, a network analyzer, or a time interval analyzer.

5. The method of claim 1, wherein the second circuit is coupled to the first circuit via the first flexible transmission line and comprises a resistor and a capacitor that are connected in parallel.

6. The method of claim 5, wherein the fourth circuit is coupled to the third circuit via the second flexible transmission line and comprises a resistor and a capacitor that are connected in parallel.

7. The method of claim 6, wherein the first flexible transmission line comprises a first coaxial cable, and the second flexible transmission line comprises a second coaxial cable.

8. The method of claim 1, wherein the voltage value is equivalent to a plurality of volts per amp times the difference between the value of the current of the first signal and the value of the current of the second signal.

9. The method of claim 8, wherein a differential amplifier circuit generates the third signal.

10. The method of claim 9, wherein the third signal is transmitted to the measuring instrument via a coaxial cable that is coupled to the differential amplifier circuit.

11. The method of claim 1, wherein the first transmission pole is an inverse of the first transmission zero.

12. The method of claim 1, wherein the first transmission pole substantially cancels an effect of the first transmission zero.

13. The method of claim 1, wherein the second transmission pole is an inverse of the second transmission zero.

14. The method of claim 1, wherein the second transmission pole substantially cancels an effect of the second transmission zero.

15. A voltage probe comprising:
    a first signal lead configured to receive a first signal from a device under test;
    a first probe-tip network configured within a probe tip unit, the first probe-tip network being coupled to the first signal lead and having a frequency response that includes a first transmission zero;
    a first flexible transmission line that remotely couples the probe tip unit to an amplifier unit;
    a first compensation network configured within the amplifier unit, the first compensation network being coupled to the first probe-tip network via the first flexible transmission line and having a frequency response that includes a first transmission pole;
    a second signal lead configured to receive a second signal from the device under test;
    a second probe-tip network configured within the probe tip unit the second probe-tip network being coupled to the second signal lead and having a frequency response that includes a second transmission zero;
    a second flexible transmission line that remotely couples the probe tip unit to the amplifier unit;
    a second compensation network configured within the amplifier unit, the second compensation network being coupled to the second probe-tip network via the second flexible transmission line and having a frequency response that includes a second transmission pole; and
    a differential amplifier circuit configured within the amplifier unit, the differential amplifier circuit being coupled to the first compensation network and to the second compensation network, and configured to provide a third signal that is responsive to the first signal and to the second signal.

16. The voltage probe of claim 15, wherein the third signal has a voltage value that is responsive to a difference between a value of a current of the first signal and a value of a current of the second signal.

17. The voltage probe of claim 16, wherein the voltage value is equivalent to a plurality of volts per amp times the difference between the value of the current of the first signal and the value of the current of the second signal.

18. The voltage probe of claim 15, further comprising a coaxial cable that is coupled to the differential amplifier circuit and that is configured to conduct the third signal to a measuring instrument.

19. The voltage probe of claim 18, wherein the measuring instrument is one of an oscilloscope, a spectrum analyzer, a logic analyzer, a vector analyzer, a network analyzer, or a time interval analyzer.

20. The voltage probe of claim 15, wherein the first probe-tip network and the second probe tip network each include a resistor and a capacitor that are connected in parallel.

21. The voltage probe of claim 15, wherein the first flexible transmission line comprises a first coaxial cable, and the second flexible transmission line comprises a second coaxial cable.

22. The voltage probe of claim 15, wherein the first compensation network and the second compensation network each include a resistor and a capacitor that are connected in parallel.

23. A system for providing signals to a measuring instrument, the system comprising:

means for receiving a first signal and a second signal from a device under test;

means, within a probe-tip unit for causing a first transmission zero in a frequency response associated with the first signal;

means for transmitting the first signal from the probe-tip unit to an amplifier unit located remote from the probe-tip unit;

means, within the amplifier unit, for causing a first transmission pole in a frequency response associated with the first signal;

means, within the probe-tip unit, for causing a second transmission zero in a frequency response associated with the second signal;

means for transmitting the second signal from the probe-tip unit to the amplifier unit;

means, within the amplifier unit, for causing a second transmission pole in a frequency response associated with the second signal; and means, within the amplifier unit, for providing a third signal to the measuring instrument, the third signal having a voltage value that is responsive to a difference between a value of a current of the first signal and a value of a current of the second signal.

24. The system of claim 23, wherein the means for causing the first transmission zero comprises a first probe-tip network having a resistor and a capacitor connected in parallel, and the means for causing the second transmission zero comprises a second probe-tip network having a resistor and a capacitor connected in parallel.

25. The system of claim 23, wherein the measuring instrument is one of an oscilloscope, a spectrum analyzer, a logic analyzer, a vector analyzer, a network analyzer, or a time interval analyzer.

26. The system of claim 23, wherein the means for causing the first transmission pole comprises a first compensation network having a resistor and a capacitor connected in parallel, and the means for causing the second transmission pole comprises a second compensation network having a resistor and a capacitor connected in parallel.

27. The system of claim 23, wherein the means for providing the third signal to the measuring instrument comprises a differential amplifier circuit.

* * * * *